United States Patent
Nguyen et al.

(10) Patent No.: US 8,699,247 B2
(45) Date of Patent: Apr. 15, 2014

(54) CHARGE PUMP SYSTEM DYNAMICALLY RECONFIGURABLE FOR READ AND PROGRAM

(75) Inventors: Qui Vi Nguyen, San Jose, CA (US); Jonathan Huynh, San Jose, CA (US)

(73) Assignee: SanDisk Technologies Inc., Plano, TX (US)

(*) Notice: Subject to any disclaimer, the term of this patent is extended or adjusted under 35 U.S.C. 154(b) by 376 days.

(21) Appl. No.: 13/228,605

(22) Filed: Sep. 9, 2011

(65) Prior Publication Data

US 2013/0063118 A1    Mar. 14, 2013

(51) Int. Cl.
*H02M 3/18* (2006.01)
*G05F 1/10* (2006.01)

(52) U.S. Cl.
USPC .............................................. 363/59; 327/536

(58) Field of Classification Search
CPC ... G11C 5/145; H02M 3/07; H02M 2001/009
USPC ................................ 363/59, 60; 327/535, 536
See application file for complete search history.

(56) References Cited

U.S. PATENT DOCUMENTS

| | | |
|---|---|---|
| 3,697,860 A | 10/1972 | Baker |
| 4,271,461 A | 6/1981 | Hoffman et al. |
| 4,511,811 A | 4/1985 | Gupta |
| 4,583,157 A | 4/1986 | Kirsch et al. |
| 4,636,748 A | 1/1987 | Latham |
| 4,736,121 A | 4/1988 | Cini et al. |
| 4,888,738 A | 12/1989 | Wong et al. |
| 5,140,182 A | 8/1992 | Ichimura |
| 5,168,174 A | 12/1992 | Naso et al. |
| 5,175,706 A | 12/1992 | Edme |
| 5,263,000 A | 11/1993 | Van Buskirk et al. |
| 5,335,198 A | 8/1994 | Van Buskirk et al. |
| 5,392,205 A | 2/1995 | Zavaleta |
| 5,436,587 A | 7/1995 | Cernea |
| 5,483,434 A | 1/1996 | Seesink |

(Continued)

FOREIGN PATENT DOCUMENTS

| | | |
|---|---|---|
| DE | 10 2007 02629 | 7/2008 |
| EP | 0 382 929 A | 8/1990 |

(Continued)

OTHER PUBLICATIONS

Feng Pan et al., "Charge Pump Circuit Design", McGraw-Hill, 2006, 26 pages.

(Continued)

*Primary Examiner* — Matthew Nguyen
(74) *Attorney, Agent, or Firm* — Davis Wright Tremaine LLP

(57) ABSTRACT

A charge pump system can provide multiple regulated output levels, including several concurrently, in an arrangement that can reduce the area and power consumption of such a high voltage generation system. The charge pump system can be dynamically reconfigurable based on output requirements. When output level is low, but required for a large AC, DC load, the system is configured in parallel to share the load. When a higher output is required, such as for a programming in a non-volatile memory, the system is configured in serial to generate the desired high output level. The exemplary embodiment uses all of the pump units in each operation and, hence, is able to be optimized for smaller pump area and less power consumption, while still delivering the same pump ability as larger, more power consuming arrangements.

11 Claims, 4 Drawing Sheets

(56) References Cited

U.S. PATENT DOCUMENTS

| | | | |
|---|---|---|---|
| 5,508,971 | A | 4/1996 | Cernea et al. |
| 5,521,547 | A | 5/1996 | Tsukada |
| 5,563,779 | A | 10/1996 | Cave et al. |
| 5,563,825 | A | 10/1996 | Cernea et al. |
| 5,568,424 | A | 10/1996 | Cernea et al. |
| 5,570,315 | A | 10/1996 | Tanaka et al. |
| 5,592,420 | A | 1/1997 | Cernea et al. |
| 5,596,532 | A | 1/1997 | Cernea et al. |
| 5,602,794 | A | 2/1997 | Javanifard et al. |
| 5,621,685 | A | 4/1997 | Cernea et al. |
| 5,625,544 | A | 4/1997 | Kowshik et al. |
| 5,693,570 | A | 12/1997 | Cernea et al. |
| 5,732,039 | A | 3/1998 | Javanifard et al. |
| 5,734,286 | A | 3/1998 | Takeyama et al. |
| 5,767,735 | A * | 6/1998 | Javanifard et al. ............ 327/536 |
| 5,781,473 | A | 7/1998 | Javanifard et al. |
| 5,801,987 | A | 9/1998 | Dinh |
| 5,818,766 | A | 10/1998 | Song |
| 5,828,596 | A | 10/1998 | Takata et al. |
| 5,903,495 | A | 5/1999 | Takeuchi et al. |
| 5,943,226 | A | 8/1999 | Kim |
| 5,945,870 | A | 8/1999 | Chu et al. |
| 5,969,565 | A | 10/1999 | Naganawa |
| 5,973,546 | A | 10/1999 | Le et al. |
| 5,982,222 | A | 11/1999 | Kyung |
| 6,008,690 | A | 12/1999 | Takeshima et al. |
| 6,018,264 | A | 1/2000 | Jin |
| 6,023,187 | A | 2/2000 | Camacho et al. |
| 6,026,002 | A | 2/2000 | Viehmann |
| 6,046,935 | A | 4/2000 | Takeuchi et al. |
| 6,104,225 | A | 8/2000 | Taguchi et al. |
| 6,107,862 | A | 8/2000 | Mukainakano et al. |
| 6,134,145 | A | 10/2000 | Wong |
| 6,151,229 | A | 11/2000 | Taub et al. |
| 6,154,088 | A | 11/2000 | Chevallier et al. |
| 6,188,590 | B1 | 2/2001 | Chang et al. |
| 6,198,645 | B1 | 3/2001 | Kotowski et al. |
| 6,208,198 | B1 | 3/2001 | Lee |
| 6,249,445 | B1 | 6/2001 | Sugasawa |
| 6,249,898 | B1 | 6/2001 | Koh et al. |
| 6,275,096 | B1 * | 8/2001 | Hsu et al. ...................... 327/535 |
| 6,285,622 | B1 | 9/2001 | Haraguchi et al. |
| 6,297,687 | B1 | 10/2001 | Sugimura |
| 6,307,425 | B1 | 10/2001 | Chevallier et al. |
| 6,314,025 | B1 | 11/2001 | Wong |
| 6,320,428 | B1 | 11/2001 | Atsumi et al. |
| 6,320,796 | B1 | 11/2001 | Voo et al. |
| 6,329,869 | B1 | 12/2001 | Matano |
| 6,344,959 | B1 | 2/2002 | Milazzo |
| 6,344,984 | B1 | 2/2002 | Miyazaki |
| 6,359,798 | B1 | 3/2002 | Han et al. |
| 6,369,642 | B1 | 4/2002 | Zeng et al. |
| 6,370,075 | B1 | 4/2002 | Haeberli et al. |
| 6,400,202 | B1 | 6/2002 | Fifield et al. |
| 6,404,274 | B1 | 6/2002 | Hosono et al. |
| 6,424,570 | B1 | 7/2002 | Le et al. |
| 6,445,243 | B2 | 9/2002 | Myono |
| 6,456,170 | B1 | 9/2002 | Segawa et al. |
| 6,476,666 | B1 | 11/2002 | Palusa et al. |
| 6,486,728 | B2 | 11/2002 | Kleveland |
| 6,518,830 | B2 | 2/2003 | Gariboldi et al. |
| 6,525,614 | B2 | 2/2003 | Tanimoto |
| 6,525,949 | B1 | 2/2003 | Johnson et al. |
| 6,531,792 | B2 | 3/2003 | Oshio |
| 6,538,930 | B2 | 3/2003 | Ishii et al. |
| 6,545,529 | B2 | 4/2003 | Kim |
| 6,556,465 | B2 | 4/2003 | Wong et al. |
| 6,577,535 | B2 | 6/2003 | Pasternak |
| 6,606,267 | B2 | 8/2003 | Wong |
| 6,724,241 | B1 | 4/2004 | Bedarida et al. |
| 6,734,718 | B1 | 5/2004 | Pan |
| 6,760,262 | B2 | 7/2004 | Haeberli et al. |
| 6,781,440 | B2 | 8/2004 | Huang |
| 6,798,274 | B2 | 9/2004 | Tanimoto |
| 6,819,162 | B2 | 11/2004 | Pelliconi |
| 6,834,001 | B2 | 12/2004 | Myono |
| 6,859,091 | B1 | 2/2005 | Nicholson et al. |
| 6,878,981 | B2 | 4/2005 | Eshel |
| 6,891,764 | B2 | 5/2005 | Li |
| 6,894,554 | B2 | 5/2005 | Ito |
| 6,922,096 | B2 | 7/2005 | Cernea |
| 6,927,441 | B2 | 8/2005 | Pappalardo et al. |
| 6,933,768 | B2 | 8/2005 | Hausmann |
| 6,944,058 | B2 | 9/2005 | Wong |
| 6,975,135 | B1 | 12/2005 | Bui |
| 6,985,397 | B2 * | 1/2006 | Tokui et al. ................... 365/226 |
| 6,990,031 | B2 | 1/2006 | Hashimoto et al. |
| 6,995,603 | B2 | 2/2006 | Chen et al. |
| 7,002,381 | B1 | 2/2006 | Chung |
| 7,023,260 | B2 | 4/2006 | Thorp et al. |
| 7,030,683 | B2 | 4/2006 | Pan et al. |
| 7,113,023 | B2 | 9/2006 | Cernea |
| 7,116,154 | B2 | 10/2006 | Guo |
| 7,116,155 | B2 | 10/2006 | Pan |
| 7,120,051 | B2 | 10/2006 | Gorobets et al. |
| 7,129,759 | B2 | 10/2006 | Fukami |
| 7,135,910 | B2 | 11/2006 | Cernea |
| 7,135,911 | B2 | 11/2006 | Imamiya |
| 7,208,996 | B2 | 4/2007 | Suzuki et al. |
| 7,224,591 | B2 | 5/2007 | Kaishita et al. |
| 7,227,780 | B2 | 6/2007 | Komori et al. |
| 7,239,192 | B2 | 7/2007 | Tailliet |
| 7,253,676 | B2 | 8/2007 | Fukada et al. |
| 7,259,612 | B2 | 8/2007 | Saether |
| 7,276,960 | B2 | 10/2007 | Peschke |
| 7,279,957 | B2 | 10/2007 | Yen |
| 7,345,928 | B2 | 3/2008 | Li |
| 7,368,979 | B2 | 5/2008 | Govindu et al. |
| 7,397,677 | B1 | 7/2008 | Collins et al. |
| 7,436,241 | B2 | 10/2008 | Chen et al. |
| 7,468,628 | B2 | 12/2008 | Im et al. |
| 7,495,500 | B2 | 2/2009 | Al-Shamma et al. |
| 7,521,978 | B2 | 4/2009 | Kim et al. |
| 7,554,311 | B2 | 6/2009 | Pan |
| 7,579,903 | B2 | 8/2009 | Oku |
| 7,671,572 | B2 | 3/2010 | Chung |
| 7,696,812 | B2 | 4/2010 | Al-Shamma et al. |
| 7,772,914 | B2 | 8/2010 | Jung |
| 7,795,952 | B2 | 9/2010 | Lui et al. |
| 7,956,673 | B2 | 6/2011 | Pan |
| 7,969,235 | B2 | 6/2011 | Pan |
| 7,973,592 | B2 | 7/2011 | Pan |
| 8,093,953 | B2 | 1/2012 | Pierdomenico et al. |
| 8,159,091 | B2 * | 4/2012 | Yeates .......................... 307/110 |
| 8,193,853 | B2 | 6/2012 | Hsieh et al. |
| 8,242,834 | B2 * | 8/2012 | Chuang et al. ................ 327/536 |
| 2002/0008566 | A1 | 1/2002 | Taito et al. |
| 2002/0014908 | A1 | 2/2002 | Lauterbach |
| 2002/0075706 | A1 | 6/2002 | Foss et al. |
| 2002/0130701 | A1 | 9/2002 | Kleveland |
| 2002/0140463 | A1 | 10/2002 | Cheung |
| 2003/0128560 | A1 | 7/2003 | Saiki et al. |
| 2003/0214346 | A1 | 11/2003 | Pelliconi |
| 2004/0046603 | A1 | 3/2004 | Bedarida et al. |
| 2005/0030088 | A1 | 2/2005 | Cernea |
| 2005/0093614 | A1 | 5/2005 | Lee |
| 2005/0195017 | A1 | 9/2005 | Chen et al. |
| 2005/0237103 | A1 | 10/2005 | Cernea |
| 2005/0248386 | A1 | 11/2005 | Pan et al. |
| 2006/0098505 | A1 | 5/2006 | Cho et al. |
| 2006/0114053 | A1 | 6/2006 | Sohara et al. |
| 2006/0244518 | A1 | 11/2006 | Byeon et al. |
| 2006/0250177 | A1 | 11/2006 | Thorp et al. |
| 2007/0001745 | A1 | 1/2007 | Yen |
| 2007/0053216 | A1 | 3/2007 | Alenin |
| 2007/0069805 | A1 | 3/2007 | Choi et al. |
| 2007/0126494 | A1 | 6/2007 | Pan |
| 2007/0139099 | A1 | 6/2007 | Pan |
| 2007/0139100 | A1 | 6/2007 | Pan |
| 2007/0211502 | A1 | 9/2007 | Komiya |
| 2007/0222498 | A1 | 9/2007 | Choy et al. |
| 2007/0229149 | A1 | 10/2007 | Pan et al. |
| 2008/0012627 | A1 | 1/2008 | Kato |
| 2008/0024096 | A1 | 1/2008 | Pan |

(56) References Cited

U.S. PATENT DOCUMENTS

| | | |
|---|---|---|
| 2008/0042731 A1 | 2/2008 | Daga et al. |
| 2008/0111604 A1 | 5/2008 | Boerstler et al. |
| 2008/0116963 A1 | 5/2008 | Jung |
| 2008/0136500 A1 | 6/2008 | Frulio et al. |
| 2008/0157852 A1 | 7/2008 | Pan |
| 2008/0157859 A1 | 7/2008 | Pan |
| 2008/0218134 A1 | 9/2008 | Kawakami |
| 2008/0239802 A1 | 10/2008 | Thorpe |
| 2008/0239856 A1 | 10/2008 | Thorpe |
| 2008/0278222 A1 | 11/2008 | Conti et al. |
| 2008/0307342 A1 | 12/2008 | Furches et al. |
| 2009/0033306 A1 | 2/2009 | Tanzawa |
| 2009/0051413 A1 | 2/2009 | Chu et al. |
| 2009/0058506 A1 | 3/2009 | Nandi et al. |
| 2009/0058507 A1 | 3/2009 | Nandi et al. |
| 2009/0063918 A1 | 3/2009 | Chen et al. |
| 2009/0091366 A1 | 4/2009 | Baek et al. |
| 2009/0121780 A1 | 5/2009 | Chen et al. |
| 2009/0153230 A1 | 6/2009 | Pan et al. |
| 2009/0153231 A1 | 6/2009 | Pan et al. |
| 2009/0153232 A1 | 6/2009 | Fort et al. |
| 2009/0167418 A1 | 7/2009 | Ragavan |
| 2009/0174441 A1 | 7/2009 | Gebara et al. |
| 2009/0219077 A1 | 9/2009 | Pietri et al. |
| 2009/0296488 A1 | 12/2009 | Nguyen et al. |
| 2009/0315616 A1 | 12/2009 | Nguyen et al. |
| 2009/0322413 A1 | 12/2009 | Huynh et al. |
| 2010/0019832 A1 | 1/2010 | Pan |
| 2010/0074034 A1 | 3/2010 | Cazzaniga |
| 2010/0085794 A1 | 4/2010 | Chen et al. |
| 2010/0244935 A1 | 9/2010 | Kim et al. |
| 2011/0133820 A1 | 6/2011 | Pan |
| 2011/0133821 A1* | 6/2011 | Honda ............................ 327/536 |
| 2011/0148509 A1 | 6/2011 | Pan |
| 2013/0162229 A1* | 6/2013 | Chan ............................ 323/268 |

FOREIGN PATENT DOCUMENTS

| | | |
|---|---|---|
| EP | 0 780 515 A | 6/1997 |
| JP | 2007-020268 A | 1/2007 |
| WO | 01/06336 A1 | 1/2001 |
| WO | WO 2006/132757 | 12/2006 |

OTHER PUBLICATIONS

Ang et al., "An On-Chip Voltage Regulator Using Switched Decoupling Capacitors," 2000 IEEE International Solid-State Circuits Conference, 2 pages.

U.S. Appl. No. 12/506,998 entitled "Charge Pump with Current Based Regulation" filed Jul. 21, 2009, 21 pages.

U.S. Appl. No. 12/634,385 entitled "Multi-Stage Charge Pump with Variable Number of Bossting Stages" filed Dec. 9, 2009, 33 pages.

Notification of Transmittal of the Int'l Searching Search Report and The Written Opinion of the International Searching Authority, or the Declaration for Int'l Appl. No. PCT/US2012/040011 dated Dec. 5, 2012, 12 pages.

U.S. Appl. No. 12/973,641, filed Dec. 20, 2010, 26 pages.

U.S. Appl. No. 12/973,493, filed Dec. 20, 2010, 28 pages.

Pylarinos et al., "Charge Pumps: An Overview," Department of Electrical and Computer Engineering, University of Toronto, Proceedings of Symposium May 2003, 7 pages.

* cited by examiner

Charging Half Cycle

Transfer Half Cycle

CHARGE PUMP SYSTEM DYNAMICALLY RECONFIGURABLE FOR READ AND PROGRAM

FIELD OF THE INVENTION

This invention pertains generally to the field of charge pumps and more particularly to charge pump systems capable of supplying multiple different output levels concurrently.

BACKGROUND

Charge pumps use a switching process to provide a DC output voltage larger than its DC input voltage. In general, a charge pump will have a capacitor coupled to switches between an input and an output. During one clock half cycle, the charging half cycle, the capacitor couples in parallel to the input so as to charge up to the input voltage. During a second clock half cycle, the transfer half cycle, the charged capacitor couples in series with the input voltage so as to provide an output voltage twice the level of the input voltage. This process is illustrated in FIGS. 1a and 1b. In FIG. 1a, the capacitor 5 is arranged in parallel with the input voltage $V_{IN}$ to illustrate the charging half cycle. In FIG. 1b, the charged capacitor 5 is arranged in series with the input voltage to illustrate the transfer half cycle. As seen in FIG. 1b, the positive terminal of the charged capacitor 5 will thus be $2*V_{IN}$ with respect to ground.

Charge pumps are used in many contexts. For example, they are used as peripheral circuits on EEPROM, flash EEPROM and other non-volatile memories to generate many of the needed operating voltages, such as programming or erase voltages, from a lower power supply voltage. A number of charge pump designs, such as conventional Dickson-type pumps, are know in the art. But given the common reliance upon charge pumps, there is an on going need for improvements in pump design, particularly with respect to trying to reduce the amount of layout area and the current consumption requirements of pumps.

FIG. 2 is a top-level block diagram of a typical charge pump arrangement. The designs described here differ from the prior art in details of how the pump section 201. As shown in FIG. 2, the pump 201 has as inputs a clock signal and a voltage Vreg and provides an output Vout. The high (Vdd) and low (ground) connections are not explicitly shown. The voltage Vreg is provided by the regulator 203, which has as inputs a reference voltage Vref from an external voltage source and the output voltage Vout. The regulator block 203 regulates the value of Vreg such that the desired value of Vout can be obtained. The pump section 201 will typically have cross-coupled elements, such at described below for the exemplary embodiments. (A charge pump is typically taken to refer to both the pump portion 201 and the regulator 203, when a regulator is included, although in some usages "charge pump" refers to just the pump section 201.)

To provide higher levels, a charge pump will boost the input voltage progressively in a series of stages. In many charge pump applications, such as for a non-volatile memory, several different regulated outputs are often needed concurrently. There is an ongoing need to improve the efficiency of such system by reducing both their power and energy requirements, while retaining accuracy of the output levels.

SUMMARY OF THE INVENTION

According to a first set of aspects, a charge pump system connected to receive an input voltage and generate from this input voltage first and second regulated output voltages respectively at first and second output nodes is presented. The system includes a first charge pump connected to receive the input voltage and provide at the first output node an output voltage generated from the input voltage. The system also includes a second charge pump connected to provide at a second output voltage at the second output node and connectable to receive the input voltage. The system further includes a third charge pump connectable to receive the input voltage. The system includes a first switch, whereby the output of the third charge pump is connectable to the first output node, and a set of second switches, whereby the output of the first charge pump can be supplied to the third charge pump and the output of the third charge pump can be supplied to the second charge pump. A first regulation circuit is connected to receive the voltage at the first output node, a second regulation circuit is connected to receive the voltage at the second output node, and control circuitry connected to the first and second switches, whereby the charge pump system can be operated in one of a first or a second mode. In the first mode, the first switch is on and the second switches are off so that the first and third charge pumps are connected in parallel to generate the output voltage at the first output node from the input voltage and be regulated by the first regulation circuit at the first regulated output voltage and the second charge pump generates the output voltage at the second output node from the input voltage and is regulated by the second regulation circuit at the second regulated output voltage. In the second mode, the first switch is off and the second switches are on so that the first charge pump generates the output voltage at the first output node from the input and is regulated by the first regulation circuit at the first regulated output voltage and the third and second charge pumps are connected in series to generate the output voltage at the second output node from the first output voltage and be regulated by the second regulation circuit at the second regulated output voltage. The second regulated output voltage is higher than the first regulated output voltage, and the second regulated output voltage is higher in the second mode than in the first mode.

In other aspects, a method of operating a charge pump system to provide a first and a second regulated voltage at respective first and second output nodes is presented. The includes selectively operating the charge pump system in a first mode or in a second mode. The first mode concurrently includes operating a first charge pump and a second charge pump in parallel to generate from an input voltage a first output voltage at the first output node and operating a third charge pump to generate from the input voltage a second output voltage at the second output node. The first mode also includes regulating the first output voltage at a first regulated level and regulating the second output voltage a second regulated level, wherein the second regulated level is higher that the first regulated level. The second mode concurrently includes operating the first charge pump to generate from the input voltage a first output voltage at the first output node and operating the first charge pump, the second charge pump, and the third charge pump in series to generate from the input voltage a second output voltage at the second output node. The second mode also includes regulating the first output voltage at a first regulated level and regulating the second output voltage a second regulated level, wherein the second regulated level is higher that the first regulated level, and wherein the second regulated voltage of the second mode is higher than the second regulated voltage of the first mode.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

BRIEF DESCRIPTION OF THE DRAWINGS

The various aspects and features of the present invention may be better understood by examining the following figures, in which.

DETAILED DESCRIPTION

The following presents a charge pump system to provide multiple regulated output levels, including several concurrently, in an arrangement that can reduce the area and power consumption of such a high voltage generation system. The charge pump system can be dynamically reconfigurable based on output requirements. When output level is low, but required for a large AC, DC load, the system is configured in parallel to share the load. When a higher output is required, such as for a programming voltage VPGM in a non-volatile memory, the system is configured in serial to generate the desired high output level. The exemplary embodiment uses all of the pump units in each operation and, hence, is able to be optimized for smaller pump area and less power consumption, while still delivering the same pump ability as larger, more power consuming arrangements.

Figure 1A:
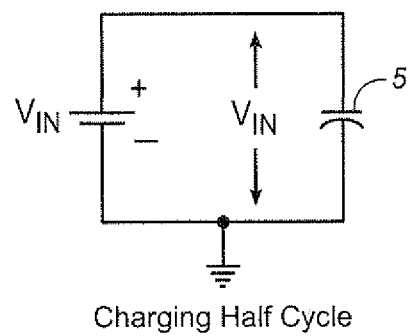
FIG. 1a is a simplified circuit diagram of the charging half cycle in a generic charge pump.
Figure 1B:
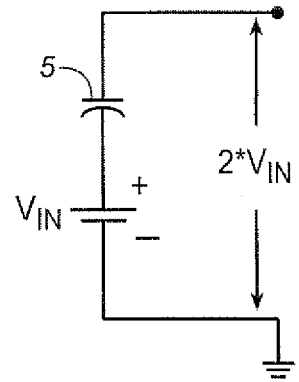
FIG. 1b is a simplified circuit diagram of the transfer half cycle in a generic charge pump.
Figure 2:
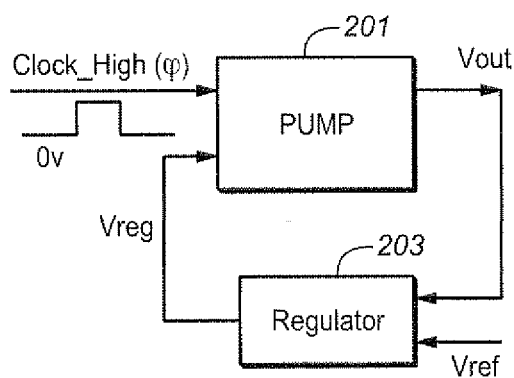
FIG. 2 is a top-level block diagram for a regulated charge pump.
Figure 3:
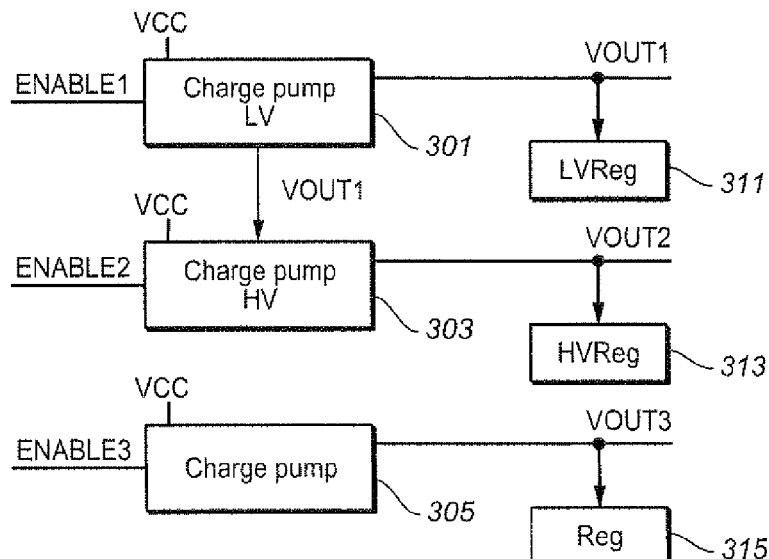
FIG. 3 is an example of a multi-pump, multi-output charge pump system.

To provide some context, before presenting the exemplary embodiment, an example of an alternate charge pump system is discussed with respect to FIG. 3. The system of FIG. 3 is designed with three charge pumps to provide three regulated levels boosted above the supply level. A low voltage chare pump LV 301 generates VOUT1 and is regulated by LVReg 311 that receives VOUT1 and regulates the pump to the desired level. A high voltage charge pump HV 303 has as an input VOUT1 from the LV pump 301, which it then boosts through one or more additional stages to generate the output VOUT2, which is regulated by HVReg 313. A third charge pump 305 generates at third level VOUT3, regulated by Reg 315. For example, in a non-volatile memory system, such as a NAND-type flash memory, and VOUT3 could be used as a supply for decoding read levels during verify operations. Each of the three pumps is enabled independently by one of the corresponding signals ENABLE1, ENABLE2, and ENABLE3.

Figure 4:
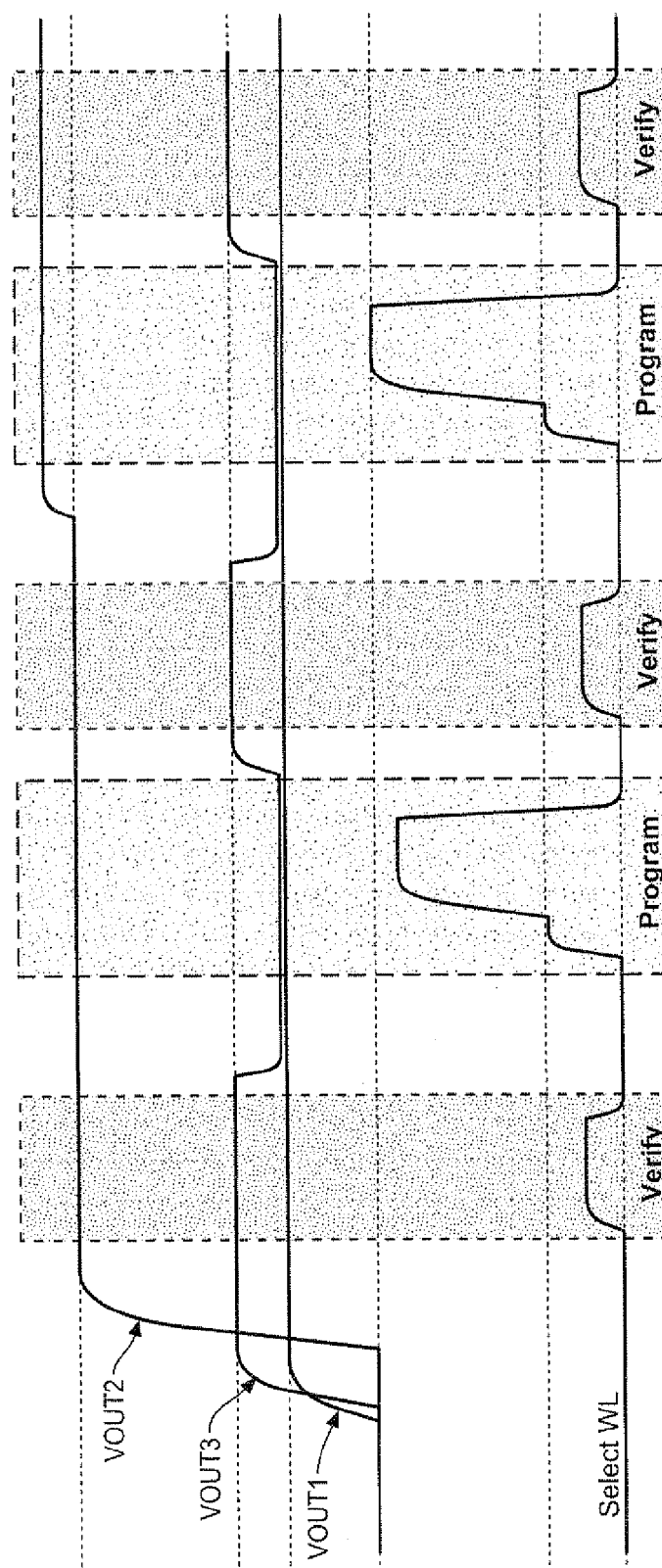
FIG. 4 illustrates the operation of the system of FIG. 3.

FIG. 4 shows the values of VOUT1, VOUT2 and VOUT3 and the level on a selected word line when these output levels are applied for a NAND memory during a programming operation. VOUT1 is used for supplying column or bit line related voltages, for example, and is enabled at the beginning of any operation and regulated at the same level for all of the operation. VOUT2 is used to supply the selected word line with the programming voltage VPGM and also for the decoding voltage used to pass the VPGM level during the program operation. VOUT2 is kept in regulation during verify operation between each programming pulse and increased by the step size of the programming pulse (dVPGM) after verify, if needed. VOUT3 is regulated to supplied to the decoding circuitry to (VREADH/VREADHH) to pass sensing levels to the word lines during the verify phase and regulated at a lower level during the programming phase for supplying unselected word lines in various boosting options and also select gate levels for NAND strings. Note that under this arrangement, VOUT2 is kept high during the whole of the program operation, even during the verify phase, only being stepped up for each step of the programming waveform.

Figure 5:
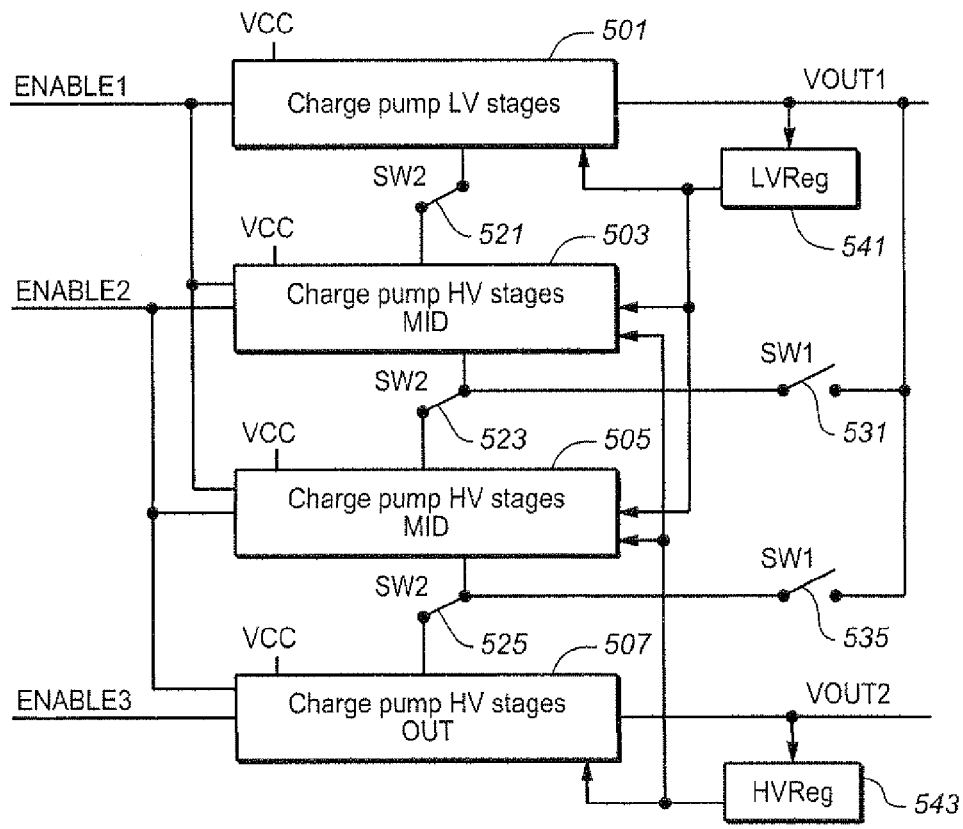
FIG. 5 is a exemplary embodiment for a charge pump system having multiple regulated output levels.

FIG. 5 shows an exemplary charge pump system that displays many of the aspects presented here. The charge pump system provides two regulated outputs, VOUT1 and a higher VOUT2, and is operable in two modes having different values for VOUT2. The pump system of FIG. 5 is constructed of a relatively low voltage charge pump LV 501 and several higher voltage charge pumps with stages. The higher voltage charge pumps stages are distinguished by the ability to delivery an output with high voltage level without violated devices EDR (Electrical Design Rule). The high voltage charge pumps are designed with ability to start with either the high on-device supply level (VCC) as input or with the input from another pumps output. In the example of FIG. 5, the high voltage stages pumps includes or more (here 2) MID stages 503 and 505 and a pump OUT 507 that can start with VCC when the SW2 switches 521, 523, and 525 are OFF, or with previous pump's output when the SW2 switches 521, 523, and 525 are ON. The switches SW1 531 and 533 are added between the HV stages MID pumps 503, 505 outputs and VOUT1. This allows the MID pumps to work parallel with LV pump 501 to supply the VOUT1 load. The SW2 switches between the pumps allows all the pump units to configured in series to supply the sort of high output, such as needed to supply program.

The system of FIG. 5 shows a particular arrangement for the enable signals. A signal ENABLE1 controls the LV charge pump 501, with ENABLE1=high when VOUT1 is required. Both ENABLE1 and ENABLE2 are connected to control the HV pumps MID 503 and 505. For example, in an application for a NAND, during a read and verify the memory could set ENABLE1=high, ENABLE2=0, and both SW1 531 and 533 are enabled. The pumps MID 503 and 505 have their outputs connected in parallel to assist pump LV 501 to supply the AC/DC load connected to VOUT1. (The MID pumps 503 and 505 can be designed to provide the same amount of boost, say a factor of 4, as the LV pump 501, but capable of handling the higher voltages when used in the high voltage mode.) During a program, when both ENABLE1 and ENABLE2 are high, the SW2 switches 521, 523, 525 are enabled. The pumps MID 503 and 505 take input from previous pump and generate a very high output for the HV pump OUT 507. Both of ENABLE2 and ENABLE3 control HV pump OUT 507. During read and verify, only ENABLE3 is high and ENABLE2 low, and the HV pump OUT 507 generate VOUT2 from VCC for decoding for the switches to pass the read voltage. During program, to generate the pulse level both ENABLE2 and ENABLE3 are high, the HV pump OUT 507 takes input from pump MID 505 and generates a very high VOUT2 for VPGM and also to supply the decoding circuits to pass VPGM. The ENABLE signals can be supplied from a the state machine (not shown) on the memory, for example, while switches can be internally controlled to meet any timing constraints.

VOUT1 is connected to the regulation circuitry LVReg 541, which then is used to control the pump 501 and, when being used to supply VOUT1, the MID pumps 503 and 505. The output VOUT2 is received at the high voltage regulation circuitry HVReg 543 to regulate the high voltage pumps OUT 507 and, when being used to supply VOUT2, the MID pumps 503 and 505. (Here, when, the MID pumps 503 and 505 are in serial with the OUT pump 507 to generate VOUT2, all of these pump receive the same flag, but in other arrangements could be used, such as using the different flags to differentially regulate the pumps as they are at different points in the boosting chain.) In this arrangement, HVReg 543 detects VOUT2 and send a flag signal to stop internal pump clock of MID pumps 503, 505 and OUT pump 507 when connecting in serial. Since VOUT1 already regulated by LVReg 541 and has its own flag to control internal LV stages for pump 501, the system does need to send the HVReg flag to LV pump 501. Similarly, during Read/Verify operations, since pumps MID 503, 505 and LV stages 501 are regulated with the same regulators, the flag from LVReg also controls the internal pump clocks (or however regulated) for MID pumps 503, 505 during this Read/Verify operation. Examples of appropriate regulation circuitry is given in the references cited below.

Figure 6:
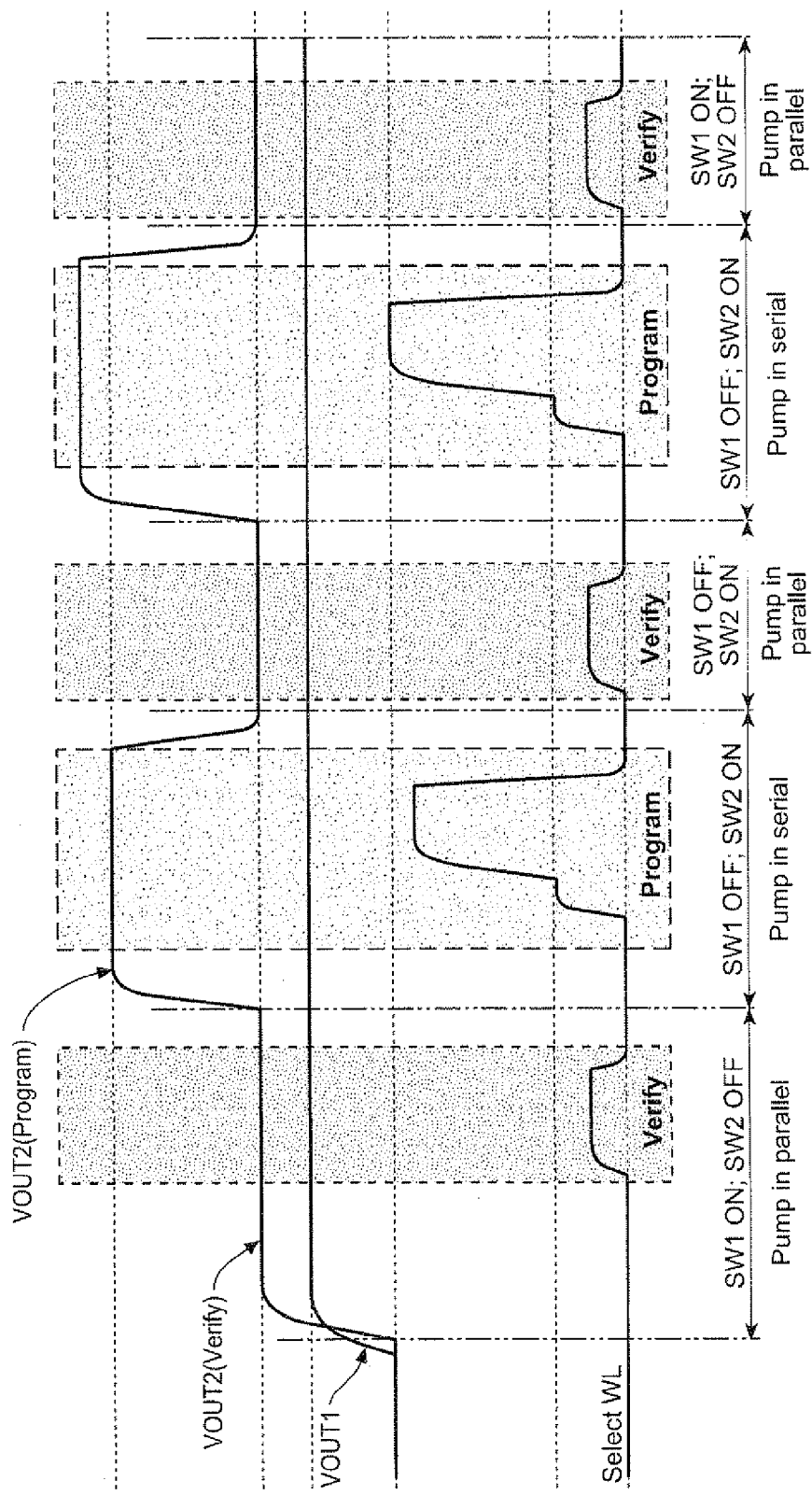
FIG. 6 illustrates the operation of the system of FIG. 5.

Consequently, by use of the switches SW1 and SW2 the system of can operate in two modes. In each mode, the system provides two regulated outputs, VOUT1 and VOUT2. In the first mode, when the SW1 switches are on and the SW2 switches are off, the MID pumps 503 and 505 contribute to VOUT1, generating this from VCC, as does the LV pump 501. In this mode, the HV pump 507 also uses VCC as the starting point, but to generate VOUT2 by, for example, using more stages than the other pumps. In the second mode, the SW1 switches are off, while the SW2 switches are on. In this mode, the LV pump 501 is still generating VOUT1 from VCC. The other pumps are now connected in series, so that the VOUT1 is now the input to the MID pump 503, which is in turn to the input to the MID pump 505, with the HV OUT pump 607 now starting with this already boosted level as its input to generate a higher output. This is illustrated by FIG. 6.

During read operations, all SW2 are OFF, with the internal HV stages pump MID and OUT are all starting with VCC as their input. The output of HV pump MID are passed through the SW1 switches to help VOUT1 supply for its large AC and DC load. FIG. 6 shows the application of the system of FIG. 5 to a write operation of a NAND type flash memory, where the two modes are alternately used as verify and programming pulse in the sequence as shown. Starting with an initial verify, the LV pump 501 and the HV pumps MID 503, 505 are configured in parallel to help VOUT1 carry a large AC and DC load for the verify operation. HV pump OUT 507 starts from VCC and generates a VOUT2 level that, while lower than used for a programming pulse, is high enough to pass the voltages used on the word lines for the sense operation of the verily, typically about 12V. After completing the first verify and done assisting VOUT1 setup for the program phase, the HV stage pumps 503, 505, 507 are configured in serial to bring VOUT2 to very high level for the VPGM level and also supply decoding switches the supply this level to the selected word lines. The verify and pulse phases continue to alternate until the write operation is complete, with the VOUT2 level during the program phase being stepped up as each pulse.

The main aspects being discussed here relate mainly to the relation of the different pumps and the topology of their connections to supply the different output level. As to the specifics of the pumps themselves, various designs may be used. In FIG. 5, as well as in the preceding figures, only a block representation of charge pumps and a basic implementation of regulation circuitry has been given. With respect to the charge pump itself, any of the various designs (voltage doubler, Dickson type, and so on) can be used. Similarly, there are may ways for how the output is regulated based upon the control signal, such as varying the frequency of the input clock signal, the amplitude of the input voltage, the number of stages, and so on. More details on these aspects, which can be applied to the exemplary embodiments below as well as to the examples above can be found, for example, in "Charge Pump Circuit Design" by Pan and Samaddar, McGraw-Hill, 2006, or "Charge Pumps: An Overview", Pylarinos and Rogers, Department of Electrical and Computer Engineering University of Toronto, available on the webpage "www.eecg.toronto.edu/~kphang/ece1371/chargepumps.pdf". Further information on various other charge pump aspects and designs can be found in U.S. Pat. Nos. 5,436,587; 6,370,075; 6,556,465; 6,760,262; 6,922,096; 7,030,683; 7,554,311; 7,368,979; 7,795,952; 7,135,910; 7,973,592; and 7,969,235; US Patent Publication numbers 2009-0153230-A1; 2009-0153232-A1; 2009-0315616-A1; 2009-0322413-A1; 2009-0058506-A1; US-2011-0148509-A1; 2007-0126494-A1; 2007-0139099-A1; 2008-0307342 A1; and 2009-0058507 A1; and application Ser. Nos. 12/973,641 and 12/973,493, both filed Dec. 20, 2010. Examples of a pump system with a variable number of branches can be found, for example, in U.S. Pat. No. 5,781,473 and with a variable number of stages can be found, for example, in U.S. Pat. Nos. 5,602,194, 6,151,229 6,369,642, 6,370,075 and 6,486,728 and in US Patent Publication number 2011-0133820-A1.

As discussed with respect to FIGS. 3 and 4, typical pump system designs for providing high voltages uses several pumps, where each pump is independently controlled and generates an output level when required. The charge pump which generates the program voltage (VPGM level) is enabled during program and disabled or not used in read and verify, while other lower voltage charge pump are needed to supply the typically large AC/DC load. Such an arrangement requires a large layout area and will draw a relatively large amount of power. The exemplary embodiment of FIGS. 5 and 6 is arranged with two regulated outputs and two intermediate pumps (the MID pumps 503 and 505), but other numbers of outputs and reconfigurable intermediate pumps can be used depending upon the application. Whatever the specifics of the embodiment, the approach described with respect to FIGS. 5 and 6 presents a design for a charge pump system that can be dynamically reconfigured based on output requirements. When the output level is low, but require for a large AC, DC load, the system is configured in parallel to share the load. When required for a high output, such as VPGM, the system is configured in serial, taking the output of one pump as input of the next, thereby being capable of generating a high output level for VPGM requirement. This approach can use all of the pump units in each operation and, hence, is able to optimize for smaller pump area and less power consumption, but still deliver the same pump ability as previous approaches.

Although the invention has been described with reference to particular embodiments, the description is only an example of the invention's application and should not be taken as a limitation. Consequently, various adaptations and combinations of features of the embodiments disclosed are within the scope of the invention as encompassed by the following claims.

It is claimed:

1. A charge pump system connected to receive an input voltage and generate therefrom first and second regulated output voltages respectively at first and second output nodes, comprising:
   a first charge pump connected to receive the input voltage and provide at the first output node an output voltage generated therefrom;
   a second charge pump connected to provide at a second output voltage at the second output node and connectable to receive the input voltage;
   a third charge pump connectable to receive the input voltage;
   a first switch, whereby the output of the third charge pump is connectable to the first output node;
   a set of second switches, whereby the output of the first charge pump can be supplied to the third charge pump and the output of the third charge pump can be supplied to the second charge pump;
   a first regulation circuit connected to receive the voltage at the first output node;
   a second regulation circuit connected to receive the voltage at the second output node; and
   control circuitry connected to the first and second switches whereby the charge pump system can be operated in one of a first or a second mode,
   where, in the first mode, the first switch is on and the second switches are off so that the first and third charge pumps are connected in parallel to generate the output voltage at the first output node from the input voltage and be regulated by the first regulation circuit at the first regulated output voltage and the second charge pump generates the output voltage at the second output node from the input voltage and is regulated by the second regulation circuit at the second regulated output voltage, and
   where, in second mode, the first switch is off and the second switches are on so that the first charge pump generates the output voltage at the first output node from the input and is regulated by the first regulation circuit at the first regulated output voltage and the third and second charge pumps are connected in series to generate the output voltage at the second output node from the first output voltage and be regulated by the second regulation circuit at the second regulated output voltage,
   wherein the second regulated output voltage is higher than the first regulated output voltage, and the second regulated output voltage is higher in the second mode than in the first mode.

2. The charge pump system of claim 1, further comprising:
   a fourth charge pump connectable to receive the input voltage;
   an additional first switch connected to the control circuitry, whereby the output of the fourth charge pump is connectable to the first output node; and
   whereby the second set switches can provide the output of the first charge pump to the third charge pump through the fourth charge pump,
   wherein, in the first mode, the additional first switch is on so that the fourth charge pump is connected in parallel with the first and third charge pumps to generate the output voltage at the first output node from the input voltage, and where, in the second mode, the additional first switch is off and fourth charge pump is connected in series between the third and second charge pumps to generate the output voltage at the second output node from the first output voltage.

3. The charge pump system claim 1, wherein said charge pump system is formed as peripheral circuitry on a non-volatile memory circuit.

4. The charge pump system of claim 1, wherein the first and third charge pumps are responsive to a first independent enable signal, the second and third charge pumps are responsive to a second enable signal, and the second charge pump is response to a third enable signal, wherein the first, second and third enable signals can be independently asserted.

5. The charge pump system of claim 1, wherein can operate the charge pump system in a sequence of alternating first and second modes.

6. The charge pump system of claim 5, wherein level of the second regulated output voltage is increased for each second mode of alternating sequence.

7. The charge pump system of claim 1, wherein the input voltage is high supply level of the circuit upon which the charge pump system is formed.

8. A method of operating a charge pump system to provide a first and a second regulated voltage at respective first and second output nodes, comprising:
   selectively operating the charge pump system in a first mode or in a second mode, wherein the first mode concurrently includes:
      operating a first charge pump and a second charge pump in parallel to generate from an input voltage a first output voltage at the first output node;
      operating a third charge pump to generate from the input voltage a second output voltage at the second output node;
      regulating the first output voltage at a first regulated level; and
      regulating the second output voltage a second regulated level, wherein the second regulated level is higher that the first regulated level, and wherein the second mode concurrently includes:
      operating the first charge pump to generate from the input voltage a first output voltage at the first output node;
      operating the first charge pump, the second charge pump, and the third charge pump in series to generate from the input voltage a second output voltage at the second output node;
      regulating the first output voltage at a first regulated level; and
      regulating the second output voltage a second regulated level, wherein the second regulated level is higher that the first regulated level, and wherein the second regulated voltage of the second mode is higher than the second regulated voltage of the first mode.

9. The method of claim 8, wherein the method includes operating the charge pump system in a sequence of alternating first and second modes.

10. The method of claim 9, wherein the second regulated level is increased for each second mode in the sequence.

11. The method of claim 8, wherein the first mode further comprises operating a fourth charge pump in parallel with the first and second charge pumps to generate from the input voltage the first output voltage at the first output node, and
   wherein, in the second mode, the fourth charge pump is operated in series with the second charge pump between first and third charge pumps to generate from the input voltage the second output voltage at the second output node.

* * * * *